(12) United States Patent
Kandanur et al.

(10) Patent No.: US 11,127,682 B2
(45) Date of Patent: Sep. 21, 2021

(54) SEMICONDUCTOR PACKAGE HAVING NONSPHERICAL FILLER PARTICLES

(71) Applicant: Intel Corporation, Santa Clara, CA (US)

(72) Inventors: Sashi S. Kandanur, Chandler, AZ (US); David Allen Unruh, Jr., Chandler, AZ (US); Srinivas V. Pietambaram, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/606,703

(22) PCT Filed: Jun. 30, 2017

(86) PCT No.: PCT/US2017/040487
§ 371 (c)(1),
(2) Date: Oct. 18, 2019

(87) PCT Pub. No.: WO2019/005153
PCT Pub. Date: Jan. 3, 2019

(65) Prior Publication Data
US 2020/0135648 A1 Apr. 30, 2020

(51) Int. Cl.
*H01L 23/532* (2006.01)
*H01L 21/48* (2006.01)
(52) U.S. Cl.
CPC ........ *H01L 23/5329* (2013.01); *H01L 21/481* (2013.01); *H01L 21/4857* (2013.01)
(58) Field of Classification Search
CPC .............. H01L 23/5329; H01L 21/481; H01L 21/4857
See application file for complete search history.

(56) References Cited

U.S. PATENT DOCUMENTS

| | | | | |
|---|---|---|---|---|
| 6,321,734 B1* | 11/2001 | Kaminaga | ............. | H01L 21/563 123/634 |
| 6,321,794 B1* | 11/2001 | Ishida | ................... | F16L 11/118 138/121 |
| 2002/0098319 A1* | 7/2002 | Takeichi | ................ | H05K 3/323 428/99 |
| 2007/0177331 A1 | 8/2007 | Das et al. | | |
| 2010/0271831 A1 | 10/2010 | Kosowsky et al. | | |
| 2010/0295173 A1 | 11/2010 | Chang et al. | | |
| 2011/0101517 A1* | 5/2011 | Hess | ........................ | H01L 23/13 257/737 |
| 2013/0175485 A1* | 7/2013 | Kanamaru | ............... | H01B 1/22 252/514 |
| 2015/0155262 A1 | 6/2015 | Kim | | |
| 2016/0196986 A1 | 7/2016 | Liou et al. | | |

OTHER PUBLICATIONS

International Search Report and Written Opinion for International Patent Application No. PCT/US2017/040487 dated Mar. 29, 2018, 12 pgs.

* cited by examiner

*Primary Examiner* — Marc Anthony Armand
(74) *Attorney, Agent, or Firm* — Schwabe, Williamson & Wyatt, P.C.

(57) ABSTRACT

Semiconductor packages having nonspherical filler particles are described. In an embodiment, a semiconductor package includes a package substrate having a dielectric layer over an electrical interconnect. The dielectric layer includes nonspherical filler particles in a resin matrix. The nonspherical filler particles have an aspect ratio greater than one.

15 Claims, 7 Drawing Sheets

SEMICONDUCTOR PACKAGE HAVING NONSPHERICAL FILLER PARTICLES

CROSS-REFERENCE TO RELATED APPLICATION

This patent application is a U.S. National Phase Application under 35 U.S.C. § 371 of International Application No. PCT/US2017/040487, filed Jun. 30, 2017, entitled "SEMICONDUCTOR PACKAGE HAVING NONSPHERICAL FILLER PARTICLES," which designates the United States of America, the entire disclosure of which is hereby incorporated by reference in its entirety and for all purposes.

FIELD OF THE INVENTION

Embodiments are in the field of integrated circuit packages and, in particular, semiconductor packages having package substrates incorporating dielectric films.

BACKGROUND OF THE INVENTION

Multi-chip packages (MCP) include several silicon chips placed in a single semiconductor package. MCP solutions require dense input/output (IO) routing to achieve high processing performance IO density is an integrated interaction between via size, line/space pitch, bump pitch, via-to-pad alignment, pad-to-via alignment, and material (e.g., resist and thin dielectric material) properties. For example, current semi-additive process (SAP) manufacturing techniques can achieve an IO density of less than 20 IO/mm/layer.

DETAILED DESCRIPTION OF THE INVENTION

Semiconductor packages having nonspherical filler particles are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Next generation MCP solutions require denser IO routing to meet processing performance goals. An IO density of more than 100 IO/mm/layer can facilitate next generation product performance improvements. Electrical trace widths of 2 microns and spacing between electrical traces of 2 microns (2/2 L/S) can achieve that IO density. Current SAP manufacturing techniques, however, may be unable to achieve the 2/2 L/S. More particularly, a resolution of the SAP manufacturing technique can be limited by preceding lamination and planarization processes used during the manufacture of a buildup laminate of the package substrate. The buildup laminate may include a dielectric layer laminated on an electrical interconnect layer, and a planarization process may be used after dielectric lamination. A resulting flatness of the planarized surface can impact a resolution of the IO pattern formed by the SAP manufacturing technique. More particularly, the flatness must be within a depth of focus of a lithography system to achieve the 2/2 US using SAP manufacturing techniques.

Figure 1:
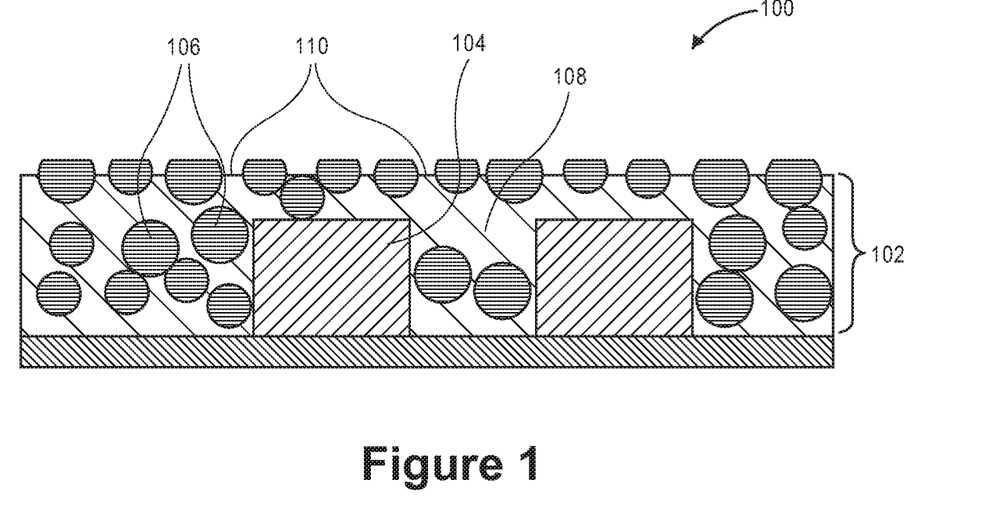
FIG. 1 illustrates a cross-sectional view of a semiconductor package substrate having spherical filler particles.

Referring to FIG. 1, a cross-sectional view of a package substrate having spherical filler particles is shown. A conventional process for fabricating a package substrate 100 may include laminating a dielectric layer 102 over an electrical interconnect 104. The dielectric layer 102 may include several spherical filler particles 106 embedded in a dielectric material 108. A planarization process may be used to flatten an upper surface of dielectric layer 102. As described below, however, a planarity of the planarized surface can depend on relative wear rates between spherical filler particles 106 and dielectric material 108. More particularly, spherical particles 106 may include a ceramic and dielectric material 108 may include a dielectric polymer having a wear rate higher than the ceramic. Thus, the planarized surface may include undulations 110. Furthermore, spherical particles 106 of dielectric layer 102 may extend vertically above the upper surface, and thus, may be prone to dislodgment and ejection during use.

The undulating surface topography can limit IO density. A nonplanar, undulating surface topography can adversely affect processes downstream of the planarization process. For example, a nonplanar surface may cause non-ideal lithographic resist lamination, which can impact lithographic exposure processes and may ultimately compromise fine line and space patterning ability. In addition, erosion and micro-scratches on the dielectric surfaces after planarization may result in reliability challenges. Accordingly, to enable improvements in IO density, improvements in planarization techniques may be needed to reduce undulations in the upper surface of dielectric layer 102.

In an aspect, a dielectric layer of a package substrate incorporates nonspherical filler particles in a dielectric matrix. In particular, filler particles having an aspect ratio greater than 1, e.g., 1.5 or higher, are incorporated in the dielectric layer. The nonspherical filler particles can exhibit increased load support compared to spherical filler particles, and thus, a post-planarization upper surface of the dielectric layer may be flatter than a post-planarization upper surface of a dielectric layer incorporating spherical filler particles.

Figure 2:
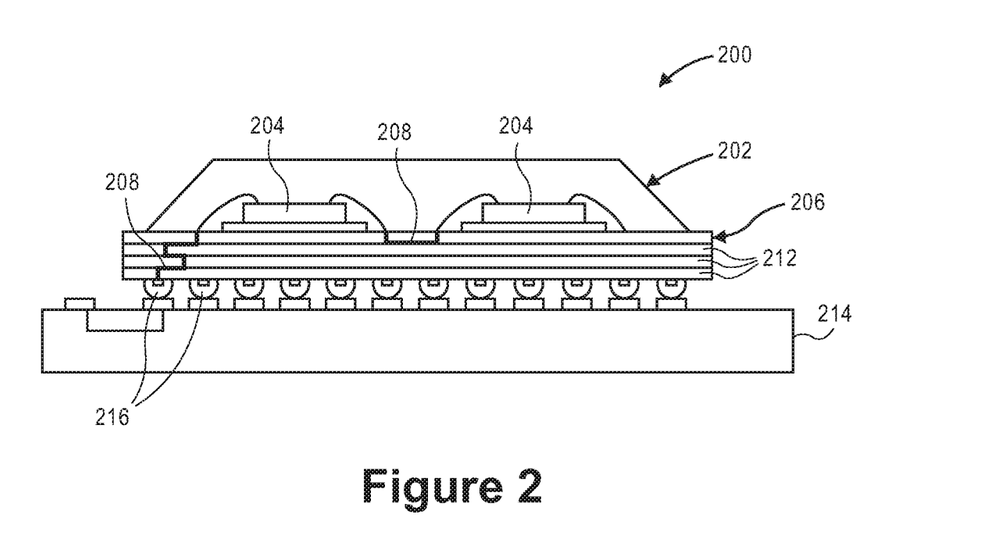
FIG. 2 illustrates a cross-sectional view of a semiconductor package assembly, in accordance with an embodiment.

Referring to FIG. 2, a cross-sectional view of a semiconductor package assembly is shown in accordance with an embodiment. A semiconductor package assembly 200 may include one or more semiconductor packages 202 having semiconductor die(s) 204. For example, semiconductor package 202 may be a multi-chip package having several semiconductor dies 204 mounted on a package substrate 206.

Semiconductor die(s) 204 may be electrically connected to each other or to external components by intervening structures, such as electrical interconnects 208. Electrical interconnects 208 may, for example, be incorporated in a build-up laminate of package substrate 206. More particularly, electrical interconnects 208 may include copper traces embedded and/or attached to one or more dielectric layers 212 of the build-up laminate. Electrical interconnects 208 may be electrically connected to other interconnect structures of dielectric layer 212, such as electrical vias. Accordingly, semiconductor die 204 may be electrically connected to electrical interconnect 208 through one or more intervening interconnect structures, and furthermore, semiconductor die 204 may be electrically connected to other components, such as a second semiconductor die 204 or a printed circuit board assembly 214 of semiconductor package assembly 200, through electrical interconnect 208.

In an embodiment, semiconductor package 202 is mounted on printed circuit board 214 to form semiconductor package assembly 200. Electrical interconnections between semiconductor die 204, package substrate 206, and printed circuit board 214 may include solder balls 216 and or other metallic bump, trace, or wire interconnects, e.g., wire bonds between semiconductor die 204 and electrical contacts on package substrate 206. By way of example, semiconductor package 202 of semiconductor package assembly 200 may be a ball grid array (BGA) component having several solder balls 216 arranged in a ball field. That is, an array of solder balls 216 may be arranged in a grid or other pattern. Each solder ball 216 may be mounted and attached to a corresponding contact pad of printed circuit board 214. Printed circuit board 214 may be a motherboard or another printed circuit board of a computer system or device, e.g., a server or a workstation. Printed circuit board 214 may include signal routing to external device connectors (not shown). Accordingly, the solder ball and contact pad attachments may provide an electrical interface between semiconductor die(s) 204 of semiconductor package 202 and an external device.

Figure 3:
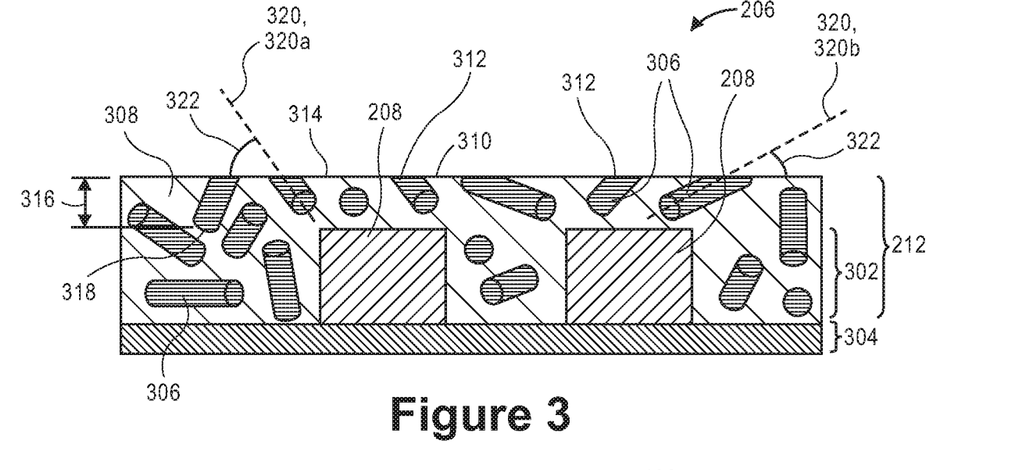
FIG. 3 illustrates a cross-sectional view of a package substrate having nonspherical filler particles, in accordance with an embodiment.

Referring to FIG. 3, a cross-sectional view of a package substrate having nonspherical filler particles is shown in accordance with an embodiment. In an embodiment, package substrate 206 includes dielectric layer 212 over an electrical interconnect layer 302. Electrical interconnect layer 302 can include one or more electrical interconnects 208. More particularly, electrical interconnects 208 in electrical interconnect layer 302 may be electrical traces or electrically vias electrically connected to semiconductor die(s) 204 of semiconductor package 202.

Dielectric layer 212 and electrical interconnect layer 302 may be one of several buildup layers of package substrate 206. For example, dielectric layer 212 and electrical interconnect layer 302 of FIG. 3 may be a first buildup layer formed on a first surface, e.g., a top surface, of core layer 304 of package substrate 206. Electrical interconnects 208 of electrical interconnect layer 302 may be encapsulated between dielectric layer 212 and core layer 304. One or more additional electrical interconnect layers 302 or dielectric layers 212 may be formed in subsequent buildup layers of package substrate 206. For example, the buildup layers may be stacked on one another, and electrical interconnects 208 in each electrical interconnect layer 302 may be encapsulated between adjacent dielectric layers 212 and electrically connected to each other. Similarly, one or more buildup layers containing respective electrical interconnect layers 302 and dielectric layers 212 may be formed on a second surface, e.g., a bottom surface, of core layer 304.

Each dielectric layer 212 of package substrate 206 may include several nonspherical filler particles 306. More particularly, dielectric layer 212 may include a composite of nonspherical filler particles 306 dispersed in a resin matrix 308. Resin matrix 308 can include an organic resin material. For example, the organic resin material may be a dielectric build-up film material. By contrast, nonspherical filler particles 306 may include an inorganic material. By way of example, nonspherical filler particles 306 may be formed from silicon dioxide, although other inorganic materials may be used.

In an embodiment, dielectric layer 212 includes a top surface 310. Top surface 310 may be a planarized surface of dielectric layer 212. More particularly, a planarization process may be used to flatten top surface 310, as described below. The planarization process may remove material from resin matrix 308 and nonspherical filler particles 306. Accordingly, some of the nonspherical filler particles 306 in dielectric layer 212 may have respective exposed surfaces 312 at top surface 310. The planarization process may remove material from resin matrix 308 and nonspherical filler particles 306 at a similar or equal rate, and thus, the exposed surfaces 312 of nonspherical filler particles 306 may be coplanar with an upper surface 314 of resin matrix 308 at top surface 310. More particularly, top surface 310 may include exposed surfaces 312 of nonspherical filler particles 306 and upper surface 314 of resin matrix 308.

Top surface 310 may be planar and may not include undulations. Accordingly, a flatness of top surface 310 may be within a range of a depth of focus of a photolithography process used to fabricate package substrate 206. By way of example, the flatness of top surface 310 may be in a range of 5-10 µm, e.g., 8 µm.

Nonspherical filler particles embedded in dielectric layer 212 can extend to a depth 316 below top surface 310. More particularly, each nonspherical filler particle 306 can include a respective filler end 318 within resin matrix 308, and depth 316 may be a distance between top surface 310 of dielectric layer 212 and the respective filler end 318. Depth 316 of the respective filler ends 318 may correspond to a verticality of nonspherical filler particles 306. More particularly, nonspherical filler particles 306 may have an elongated shape extending along a respective longitudinal axis 320, and the verticality of each nonspherical filler particle 306 may be determined based on a respective angle 322 between the respective longitudinal axis 320 and a respective exposed surface 312 of the nonspherical filler particle 306. For example, when nonspherical filler particle 306 is vertical, angle 322 between longitudinal axis 320 of the nonspherical filler particle 306 and top surface 310 is 90 degrees. By contrast, when nonspherical filler particle 306 is horizontal, angle 322 between longitudinal axis 320 of the nonspherical filler particle 306 and top surface 310 is 0 degrees. In FIG. 3, the leftward nonspherical filler particle 306 extending along longitudinal axis 320a has angle 322 that is greater than angle 322 of longitudinal axis 320b passing through the rightward nonspherical filler particle 306. Accordingly, the leftward nonspherical filler particle 306 is more vertical, i.e., closer to being orthogonal to top surface 310, than the rightward nonspherical filler particle 306. As described below, the verticality of nonspherical filler particles 306 can affect a load distribution along top surface 310 during a planarization process.

Figure 4A:
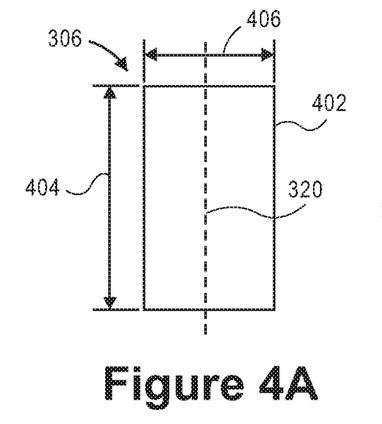
FIGS. 4A-4B illustrate side views of nonspherical filler particles, in accordance with an embodiment.

Referring to FIG. 4A, a side view of a cylindrical filler particle is shown in accordance with an embodiment. Nonspherical filler particles 306 may be characterized as having a shape that is not spherical. More particularly, nonspherical filler particles 306 may have any shape that is not spherical. For example, nonspherical filler particles 306 may include an outer surface 402 having a predetermined morphology, e.g., a cylindrical morphology or an ellipsoidal morphology, as described below. It will be understood, however, that the predetermined morphology of outer surface 402 may be any shape, e.g., a shape that is cuboidal, conical, and so on.

Nonspherical filler particles 306 may be characterized as having an aspect ratio greater than 1. The aspect ratio of nonspherical filler particles 306 may be determined by dividing a longitudinal dimension of nonspherical filler particle 306 by a transverse dimension of nonspherical filler particle 306. The longitudinal dimension may be a dimension of nonspherical filler particle 306 in a direction of longitudinal axis 320. By contrast, the transverse dimension may be a dimension of nonspherical filler particle 306 in a direction transverse or orthogonal to longitudinal axis 320.

In an embodiment, nonspherical filler particles 306 of dielectric layer 212 are cylindrical. The cylindrical nonspherical filler particles 306 may include a height 404 in a direction of longitudinal axis 320. Nonspherical filler particle 306 may include a width 406 in a direction transverse to longitudinal axis 320. For example, width 406 may be a diameter of a circular cross-section of cylindrical filler particle 306. Height 404 may be greater than width 406, and thus, the cylindrical nonspherical filler particle 306 may have an aspect ratio greater than 1.

The aspect ratio of nonspherical filler particle 306 may be higher than an aspect ratio of spherical filler particles, including manufacturing tolerances for the spherical filler particles. For example, manufacturing processes used to fabricate spherical filler particles may produce spherical particles having an aspect ratio of 1.0+/−0.1, i.e., +/−10% manufacturing tolerances. Accordingly, nonspherical filler particles 306 may have an aspect ratio not within the tolerance, e.g., an aspect ratio of 1.1 or higher. In an embodiment, nonspherical filler particles 306 have aspect ratios greater than 1.5, e.g., aspect ratios of 2 or more.

Figure 4B:
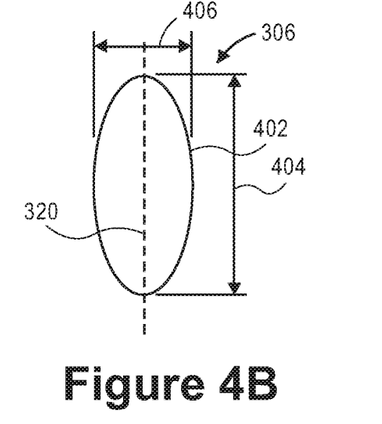

Referring to FIG. 4B, a side view of an ellipsoidal filler particle is shown in accordance with an embodiment. In an embodiment, nonspherical filler particles 306 of dielectric layer 212 are ellipsoidal. The ellipsoidal nonspherical filler particles 306 may include height 404 along longitudinal axis 320, and width 406 transverse to longitudinal axis 320. Width 406 may be a maximum cross-sectional diameter of ellipsoidal filler particle 306 in a direction transverse to longitudinal axis 320. Height 404 may be greater than width 406, and thus, the ellipsoidal nonspherical filler particle 306 may have an aspect ratio greater than 1.

The geometry of nonspherical filler particles 306 can be tailored to achieve a desired wear resistance. More particularly, the aspect ratio of nonspherical filler particles 306 can be controlled through a fabrication process. In an embodiment, nonspherical filler particles 306 are silica nanoparticles generated by a flame aerosol process. The flame aerosol process can involve gas phase reactions containing appropriate precursors. Alternatively, nonspherical filler particles 306 may be silicon oxide nanofibers generated by an electro-spinning process. More particularly, a sol-gel precursor can be electrospun to generate nanofibers having aspect ratios greater than 200. Accordingly, different manufacturing processes may be used to produce nonspherical filler particles 306 having an aspect ratio greater than 1.

Figure 5:
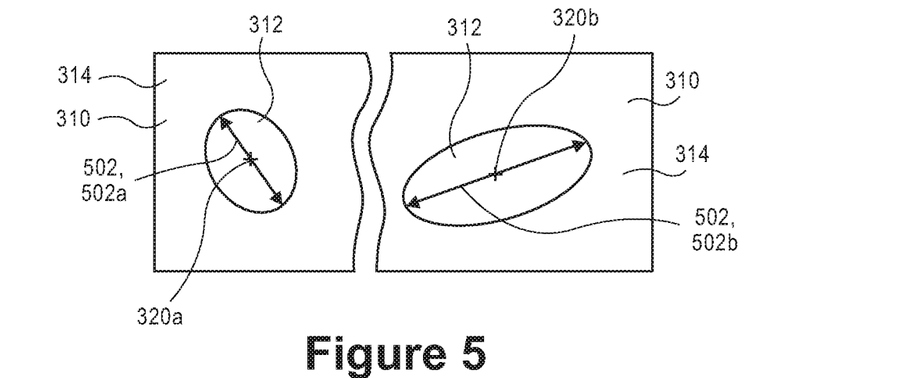
FIG. 5 illustrates a top view of exposed surfaces of nonspherical filler particles, in accordance with an embodiment.

Referring to FIG. 5, a top view of exposed surfaces of nonspherical filler particles is shown in accordance with an embodiment. Respective shapes of exposed surfaces 312 of nonspherical filler particles 306 may vary. More particularly, the exposed surfaces 312 may have respective areal shapes that depend on the morphology of nonspherical filler particle 306 and angle 322 of longitudinal axis 320 to top surface 310. In an embodiment, the exposed surfaces 312 have different areal shapes. By way of example, the leftward nonspherical filler particle 306 of FIG. 3 is more vertical than the rightward nonspherical filler particle 306 of FIG. 3, as described above. Accordingly, angle 322 of longitudinal axis 320a is greater than angle 322 of longitudinal axis 320b. The respective angles 322 of longitudinal axes 320a, 320b may relate reciprocally to respective maximum dimensions 502 of the exposed surfaces 312. For example, in the case of nonspherical filler particles 306 having a same cylindrical morphology, the leftward filler particle has exposed surface 312 including an elliptical areal shape. The elliptical areal shape has a first maximum dimension 502a. Similarly, the rightward filler particle has exposed surface 312 including an elliptical areal shape. The elliptical areal shape has a second maximum dimension 502b. Angle 322 of the leftward filler particle may be greater than angle 322 of the rightward filler particle, and thus, the leftward exposed surface 312 may be less elongated than the rightward exposed surface 312. Accordingly, the first maximum dimension 502a may be less than the second maximum dimension 502b.

Nonspherical filler particles 306 may be preferentially oriented in a vertical direction. For example, nonspherical filler particles 306 having a greater verticality may preferentially support loading from a planarization platen, as described below. Furthermore, height 404 of nonspherical filler particles 306 may be greater than width 406. Accordingly, when nonspherical filler particles 306 are oriented vertically, or when nonspherical filler particles 306 are oriented having angles 322 greater than 45 degrees, depth 316 between top surface 310 and respective filler ends 318 of the particles may be greater than respective maximum dimensions 502 of the particles. This relationship between depth 316 and maximum dimension 502 of nonspherical filler particles 306 may be maintained by, for example, incorporating nonspherical filler particles 306 having aspect ratios greater than 2, e.g., 10 or more. The relatively high depth can provide greater surface contact between outer surface 402 and resin matrix 308, which can translate to higher normal load support by nonspherical filler particles 306.

Figure 6:
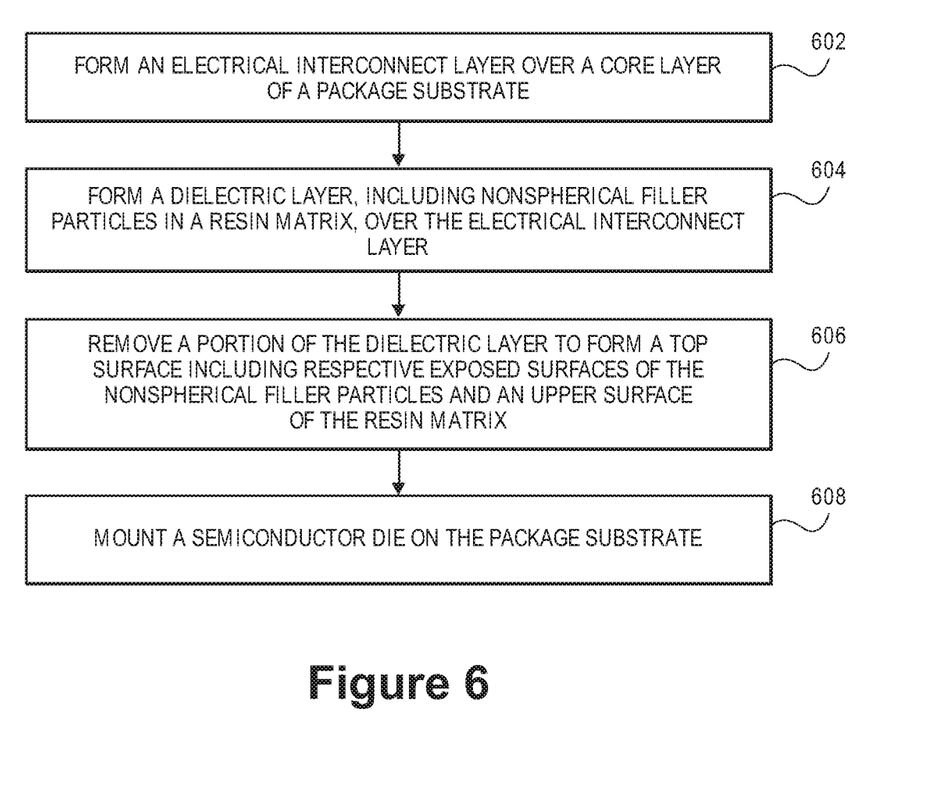
FIG. 6 illustrates a flowchart of a method of fabricating a package substrate having nonspherical filler particles, in accordance with an embodiment.
Figure 7A:
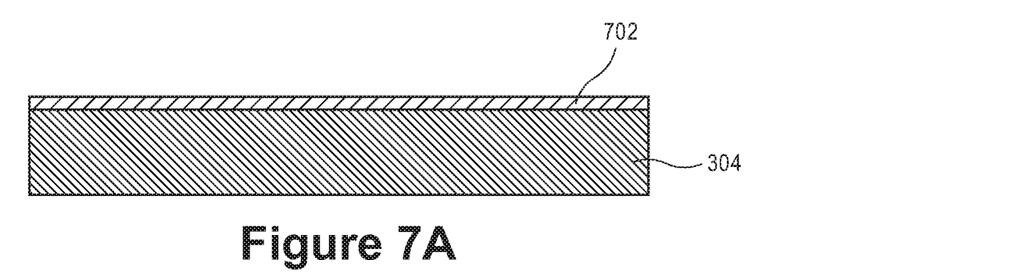
FIGS. 7A-7H illustrate operations in a method of fabricating a package substrate having nonspherical filler particles, in accordance with an embodiment.
Figure 7B:
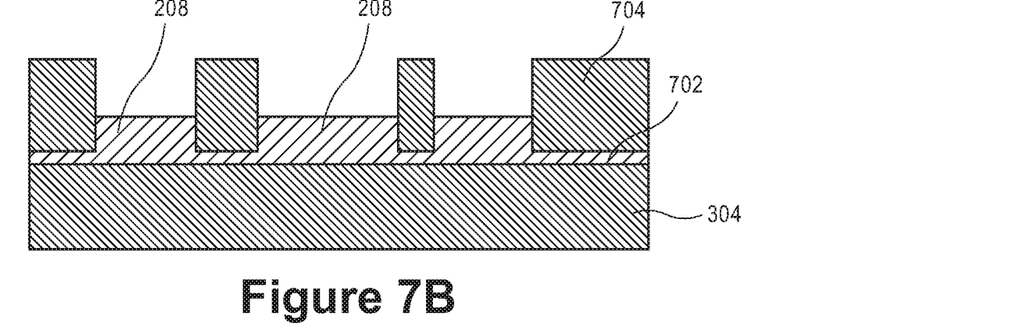
Figure 7C:
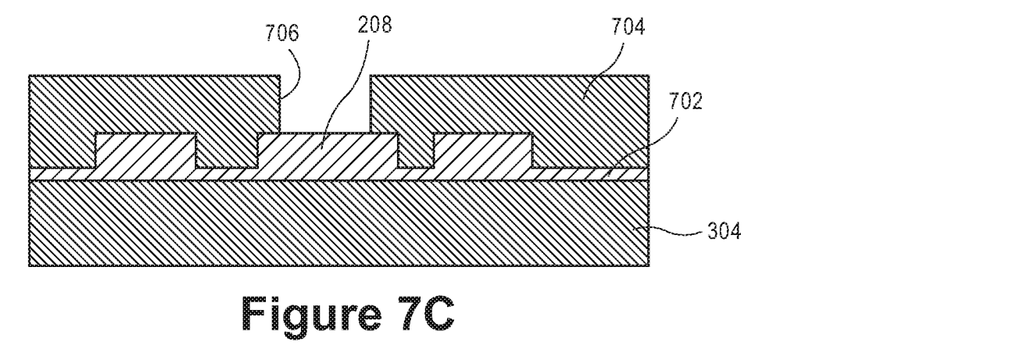
Figure 7D:
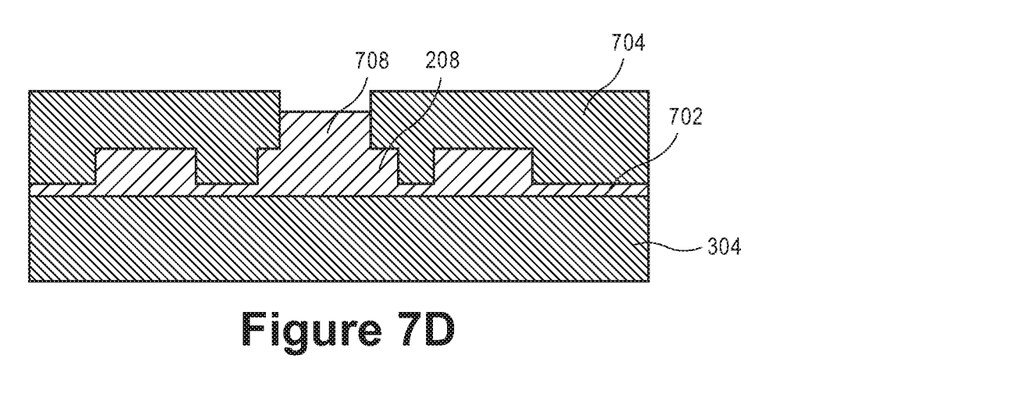

Referring to FIG. 6, a flowchart of a method of fabricating a package substrate having nonspherical filler particles is shown in accordance with an embodiment. FIGS. 7A-7H illustrate operations in the method of FIG. 6. Accordingly, FIGS. 6-7H are described together below.

The method of fabricating package substrate 206 may be a process flow for creating a very high density (VHD) organic substrate using a litho-defined via (LiV) approach. More particularly, the method may include a laser-less buildup process, such as a process involving lithography-defined vias.

At operation 602, electrical interconnect layer 302 may be formed over core layer 304 of package substrate 206. Referring to FIG. 7A, a seed layer 702 may be formed on core layer 304. For example, copper may be deposited on core layer 304 to form seed layer 702. Referring to FIG. 7B, electrical interconnects 208 may be lithographically formed on seed layer 702. For example, a photoresist 704 may be deposited onto seed layer 702 and patterned. Copper may be deposited into the pattern to form electrical interconnects 208. In an embodiment, electrical interconnects 208 on seed layer 702 are electrical traces. For example, the electrical traces may have a 2/2 L/S, i.e., a 2 micron width and a 2 micron spacing between traces. Accordingly, a first photomask process may be used to form a first substructure of electrical interconnect layer 302.

The formation of electrical interconnect layer 302 over core layer 304 may include adding structure to the first substructure. Referring to FIG. 7C, a photoresist 704 may be deposited onto the electrical traces shown in FIG. 7B, and the photoresist may be patterned to form a hole 706 over one of the electrical traces 208. Referring to FIG. 7D, copper may be deposited into the hole 706 to form an electrical via 708 extending upward from the underlying electrical trace of electrical interconnect 208. More particularly, electrical interconnect 208 may include electrical via 708 as a second substructure on an electrical trace substructure. Accordingly, a second photomask 704 process may be used to form a second substructure of electrical interconnect layer 302.

Figure 7E:
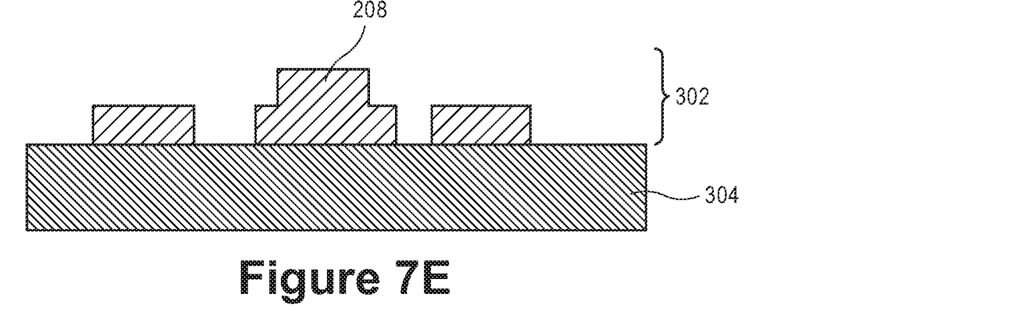

Referring to FIG. 7E, photomask 704 and the seed layer 702 may be removed and electrical interconnect 208 may be treated to promote adhesion between electrical interconnect layer 302 and an overlying dielectric layer 212. For example, electrical interconnect 208 of electrical interconnect layer 302 may be roughened to facilitate adherence between resin matrix 308 and electrical interconnect 208.

Figure 7F:
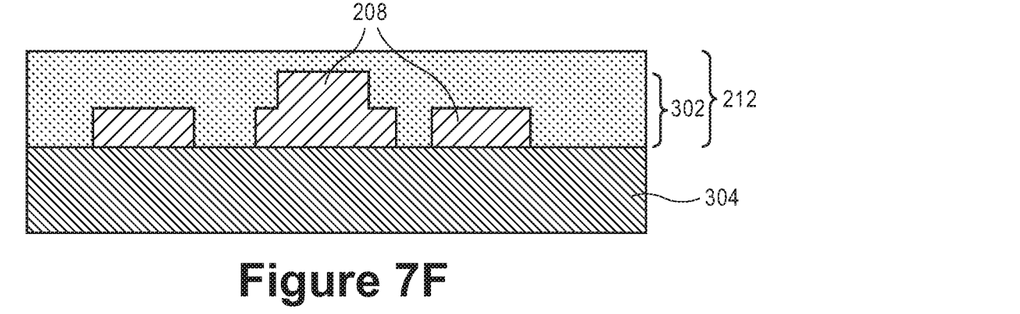

At operation 604, dielectric layer 212 may be formed over electrical interconnect layer 302. Referring to FIG. 7F, dielectric layer 212 is laminated over electrical interconnect layer 302. Dielectric layer 212 may have the structure described above, e.g., nonspherical filler particles 306 in resin matrix 308. Dielectric layer 212 may cover electrical interconnect layer 302. For example, electrical interconnect layer 302 may be encapsulated or sandwiched between dielectric layer 212 and core layer 304. Accordingly, an exposed and upward facing surface of dielectric layer 212 may be above electrical interconnect layer 302.

Figure 7G:
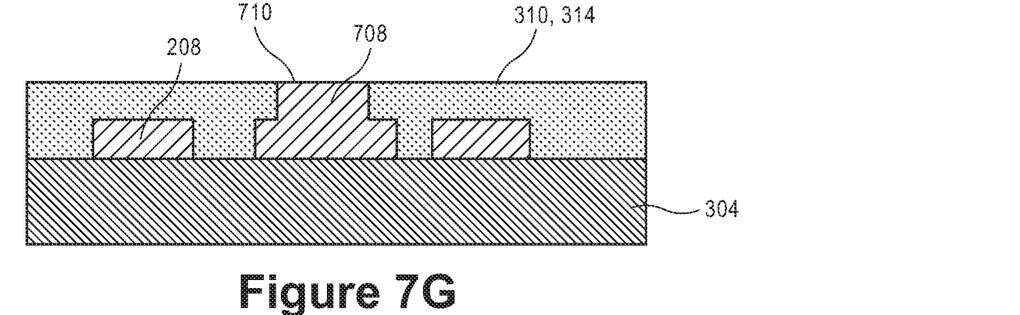
Figure 7H:
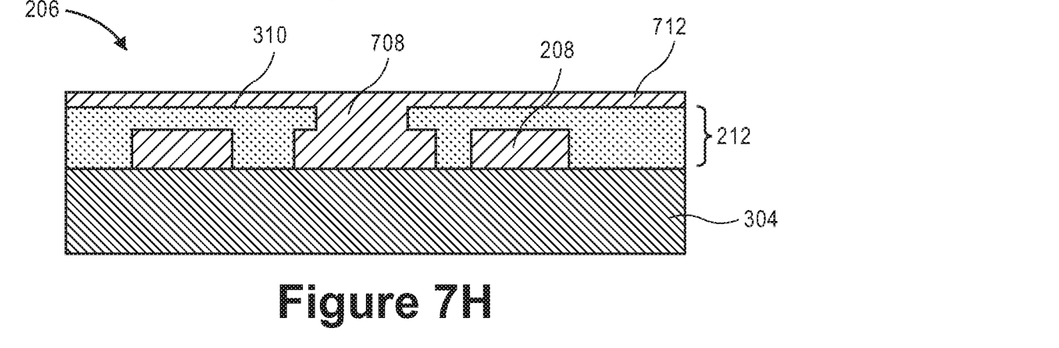

At operation 606, a portion of dielectric layer 212 may be removed to form top surface 310. Referring to FIG. 7G, a planarization process can be used to reveal the electrical vias 708 after dielectric lamination. More particularly, the planarization process may be used to form top surface 310 that includes exposed surfaces 312 of nonspherical filler particles 306 and upper surface 314 of resin matrix 308, as illustrated in FIG. 3. Removal of dielectric layer 212 material to form top surface 310 may reveal electrical via 708. Accordingly, an exposed via surface 710 may be revealed, and may be parallel to upper surface 314 of resin matrix 308. In an embodiment, exposed via surface 710 is at top surface 310, and is coplanar with exposed surfaces 312 of nonspherical filler particles 306 and upper surface 314 of resin matrix 308.

Referring to FIG. 7H, a second seed layer 712 may be formed on top surface 310 of package substrate 206. Second seed layer 712 may separate dielectric layer 212 from a second electrical interconnect layer and/or a second dielectric layer (not shown) in the buildup laminate of package substrate 206. More particularly, buildup laminate of package substrate 206 can include several buildup layers incorporating electrical interconnect layers 302 and dielectric layers 212 formed by operations similar to those described with respect to FIGS. 7A-7G. In an embodiment, second seed layer 712 supports a second electrical interconnect layer that is patterned by an SAP process. Accordingly, a flatness of top surface 310 supporting second seed layer 712 is within a depth of focus of the SAP process.

At operation 608, semiconductor die 204 may be mounted on package substrate 206. There may be other process operations prior to die-mounting. For example, a plating operation may be performed after polishing top surface 310 at operation 606. Following any intermediate process operations, semiconductor die 204 can be electrically connected to electrical interconnect layer 302, as described above. Accordingly, semiconductor package 202 having a package substrate 206 including nonspherical filler particles 306 may be fabricated.

Figure 8A:
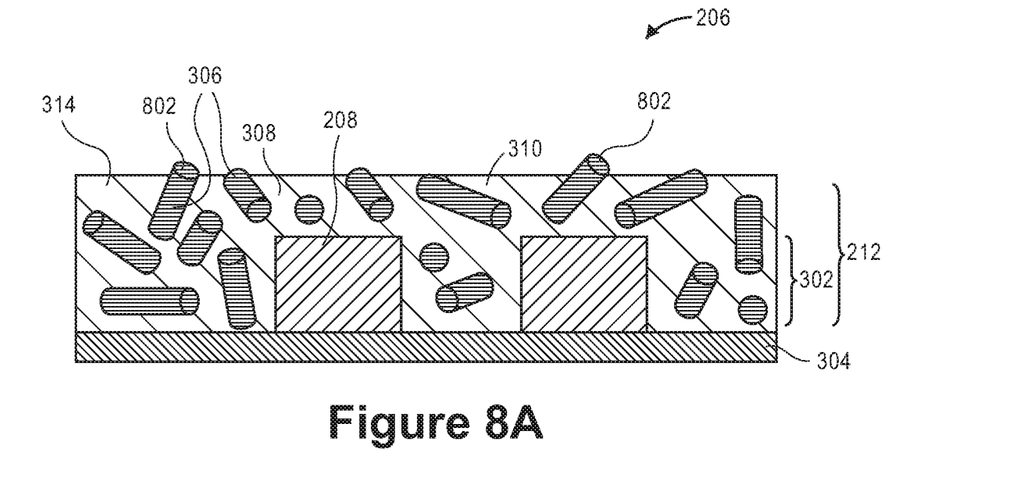
FIGS. 8A-8C are diagrams related to suboperations in a method of fabricating a package substrate having nonspherical filler particles, in accordance with an embodiment.
Figure 8B:
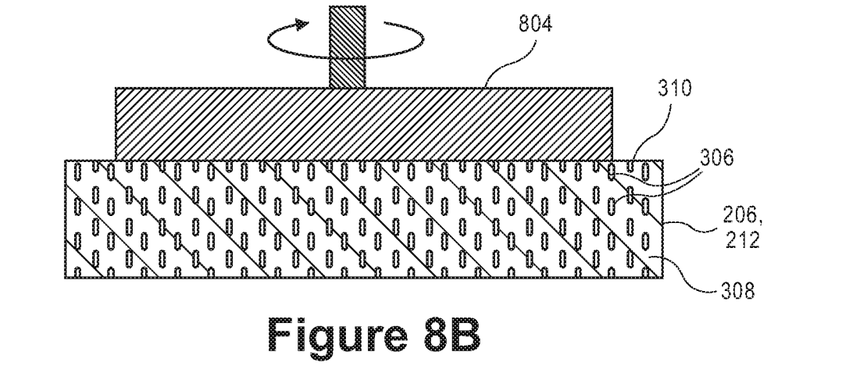
Figure 8C:
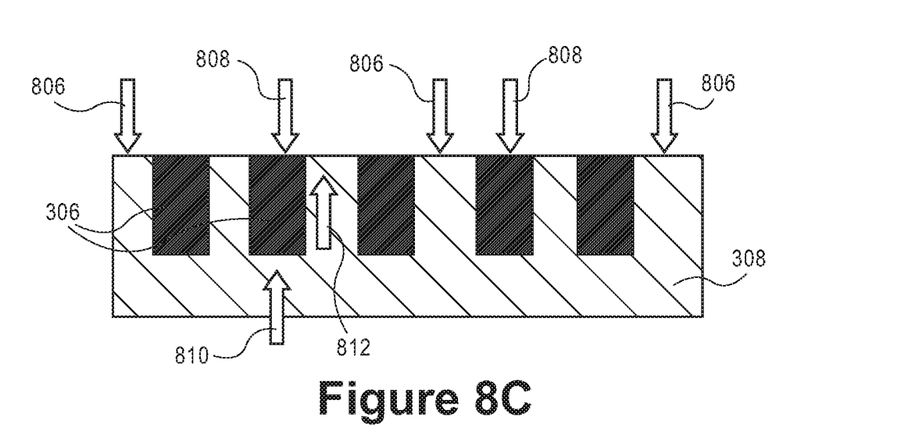

Referring to FIGS. 8A-8C, suboperations in a method of fabricating a package substrate having nonspherical filler particles are shown in accordance with an embodiment. FIG. 8 illustrates package substrate 206 after operation 604 of FIG. 6. Package substrate 206 includes dielectric layer 212 laminated over electrical interconnects 208. Dielectric layer 212 includes a mixture of nonspherical filler particles 306 and resin matrix 308. Prior to planarization, several nonspherical filler particles 306 have protruding ends 802 extending above top surface 310 of dielectric layer 212. More particularly, protruding ends 802 extend to a height above upper surface 314 of resin matrix 308.

In an embodiment, interfacial adhesion between nonspherical filler particles 306 in resin matrix 308 is enhanced. More particularly, outer surface 402 of nonspherical filler particles 306 may be functionalized. Accordingly, a sub operation of the method of fabricating package substrate 206 may include functionalizing outer surface 402 of nonspherical filler particles 306. For example, functionalizing outer surface 402 may include functionalizing the surfaces of nonspherical filler particles 306 with silanes or organosilanes. As another sub operation of the method, the functionalized nonspherical filler particles 306 can be dispersed in resin matrix 308. Accordingly, nonspherical filler particles 306 can bond to the surrounding resin matrix 308. It will be appreciated that improving interfacial adhesion between nonspherical filler particles 306 and resin matrix 308 may increase a magnitude of the loads that can be supported by nonspherical filler particles 306. More particularly, functionalized nonspherical filler particles 306 can support more normal loads because of increased load transfer between resin matrix 308 and nonspherical filler particles 306, as compared to a non-functionalized filler system. The enhanced dielectric layer 212 may then be laminated over electrical interconnect layer 302 at operation 604.

Referring to FIG. 8B, a planarization process is used to remove a portion of dielectric layer 212 at operation 606 of FIG. 6. Planarization can include pressing a platen 804 against top surface 310 of dielectric layer 212 and rotating platen 804 to wear down top surface 310. Platen 804 may be pressed against dielectric layer 212 by a normal load and rotated at a predetermined angular speed of rotation. The normal load is distributed across the contact area between platen 804 and top surface 310, and more particularly, a reaction force is applied to platen 804 by nonspherical filler particles 306 and resin matrix 308.

Referring to FIG. 8C, a load distribution diagram of the suboperation of FIG. 8B is shown. A portion of the normal load acting on resin matrix 308 may be referred to as a matrix load 806, and a portion of the normal load acting on nonspherical filler particles 306 may be referred to as a filler load 808. The wear rate of the filler particles in dielectric layer 212 depends on the magnitude of filler load 808. More particularly, the higher that filler load 808 is, the faster the filler particles will wear. In the case of conventional spherical filler particles, the normal load applied by platen 804 is sub-optimally distributed to matrix load 806, and also due to their intrinsic high wear resistance, spherical fillers do not wear as quickly as resin matrix 308, and undulations in top surface 310 can occur. Nonspherical filler particles 306 redistribute the normal load to cause a higher proportion of the normal load to be applied to the fillers as filler loads 808. Accordingly, nonspherical filler particles 306 wear faster (and at a rate closer to a wear rate of resin matrix 308) to cause the entire top surface 310 to be planar within a predetermined range of flatness. The flatness accommodates downstream process requirements.

Redistribution of normal load to the filler particles can be enhanced by higher aspect ratios of nonspherical filler particles 306. More particularly, nonspherical filler particles 306 having aspect ratios greater than 1 can exhibit increased load support compared to conventional spherical filler particles. Increasing an aspect ratio of nonspherical filler particles 306 can increase filler loads 808 because a force equilibrium in a normal direction between platen 804 and dielectric layer 212 dictates that filler load 808 is equal to a matrix load 810 acting upward on nonspherical filler particle 306 by resin matrix 308 plus an interfacial shear stress 812 modified by a multiplier that includes the aspect ratio. Matrix load 810 may equal matrix load 806. Accordingly, increasing the aspect ratio increases the filler load 808 relative to matrix load 806 and means that the filler is able to support greater normal loads. As a result, nonspherical filler particles 306 having aspect ratios greater than 1 lose more wear volume compared to spherical filler particles having aspect ratios of 1 (plus or minus manufacturing tolerances). The balanced wear rate produces a flat top surface 310.

From the above discussion, it is noted that more load is transferred to nonspherical filler particles 306 when the aspect ratio is increased or when interfacial shear stress 812 is increased. Accordingly, increasing interfacial shear strength between nonspherical filler particles 306 and resin matrix 308 using surface functionalization as described above can also redistribute the normal load to nonspherical filler particles 306. Accordingly, nonspherical filler particles 306 dispersed with, and bonded to, resin matrix 308 can lead to flatter top surface 310 of dielectric layer 212 of package substrate 206.

Figure 9:
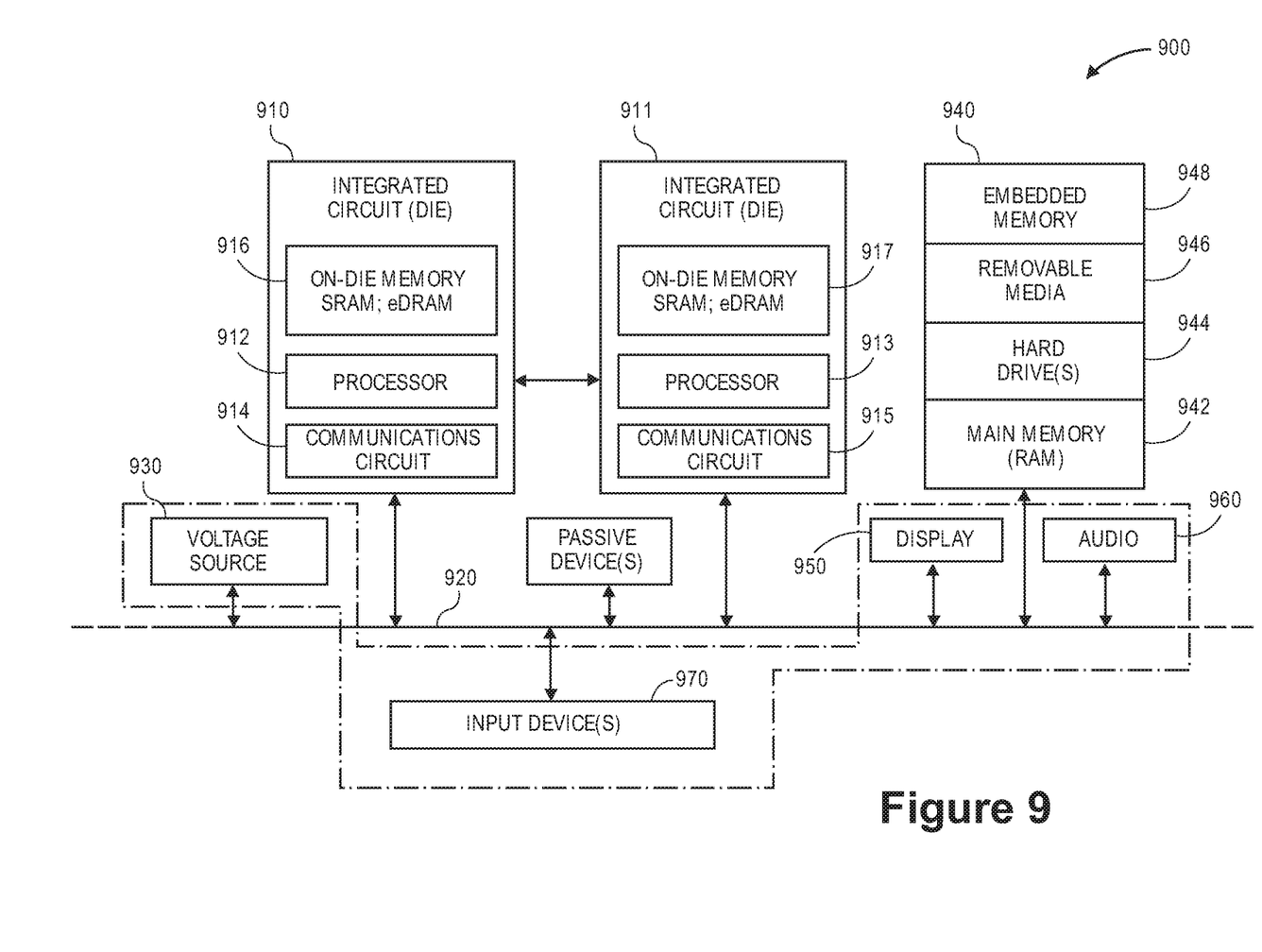
FIG. 9 is a schematic of a computer system, in accordance with an embodiment.

FIG. 9 is a schematic of a computer system is shown in accordance with an embodiment. The computer system 900 (also referred to as the electronic system 900) as depicted can embody a semiconductor package having nonspherical filler particles as described according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, a semiconductor package having nonspherical filler particles, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 911 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, and an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a semiconductor package having nonspherical filler particles, according to any of the several disclosed embodiments and their equivalents, an electronic system, a computer system, one or more methods of fabricating an integrated circuit, and one or more methods of fabricating an electronic assembly that includes a semiconductor package having nonspherical filler particles, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages having nonspherical filler particles embodiments and their equivalents. A foundation substrate may be included, as represented by the dashed line of FIG. 9. Passive devices may also be included, as is also depicted in FIG. 9.

Embodiments of semiconductor packages having nonspherical filler particles are described above. In an embodiment, a semiconductor package includes a package substrate including a dielectric layer over an electrical interconnect layer. The dielectric layer includes several nonspherical filler particles in a resin matrix. The semiconductor package includes a semiconductor die mounted on the package substrate.

In one embodiment, the resin matrix includes an organic resin material. The several nonspherical filler particles include an inorganic material.

In one embodiment, each of the several nonspherical filler particles has a respective aspect ratio greater than 1.

In one embodiment, the respective aspect ratios are greater than 1.5.

In one embodiment, the several nonspherical filler particles are cylindrical.

In one embodiment, the several nonspherical filler particles are ellipsoidal.

In one embodiment, the dielectric layer includes a top surface. The several nonspherical filler particles have respective exposed surfaces at the top surface. The respective exposed surfaces are coplanar with an upper surface of the resin matrix at the top surface.

In one embodiment, the respective exposed surfaces have different areal shapes.

In one embodiment, each of the several nonspherical filler particles includes a respective longitudinal axis at a respective angle to the respective exposed surface. The respective exposed surface has a respective maximum dimension. The respective angle relates reciprocally to the respective maximum dimension.

In one embodiment, each of the several nonspherical filler particles includes a functionalized outer surface.

In an embodiment, a semiconductor package assembly includes a printed circuit board. The semiconductor package assembly includes a semiconductor package mounted on the printed circuit board. The semiconductor package includes a package substrate including a dielectric layer over an electrical interconnect layer. The dielectric layer includes several nonspherical filler particles in a resin matrix. The semiconductor package assembly includes a semiconductor die mounted on the package substrate. The semiconductor die is electrically connected to the electrical interconnect layer.

In one embodiment, each of the several nonspherical filler particles has a respective aspect ratio greater than 1.

In one embodiment, the respective aspect ratios are greater than 1.5.

In one embodiment, the several nonspherical filler particles are one or more of cylindrical or ellipsoidal.

In one embodiment, the dielectric layer includes a top surface. The several nonspherical filler particles have respective exposed surfaces at the top surface. The respective exposed surfaces are coplanar with an upper surface of the resin matrix at the top surface.

In an embodiment, a method of fabricating a package substrate having nonspherical filler particles includes forming an electrical interconnect layer over a core layer of a package substrate. The method includes forming a dielectric layer over the electrical interconnect layer. The dielectric layer includes several nonspherical filler particles in a resin matrix. The method includes removing a portion of the dielectric layer to form a top surface. The top surface includes respective exposed surfaces of the several nonspherical filler particles and an upper surface of the resin matrix.

In one embodiment, the respective exposed surfaces of the several nonspherical filler particles are coplanar with the upper surface of the resin matrix.

In one embodiment, the electrical interconnect layer includes an electrical via having an exposed via surface at the top surface. The exposed via surface is coplanar with the respective exposed surfaces of the several nonspherical filler particles and the upper surface of the resin matrix.

In one embodiment, forming the dielectric layer includes functionalizing an outer surface of the several nonspherical filler particles. Forming the dielectric layer includes dispersing the several nonspherical filler particles in the resin matrix.

In one embodiment, the method includes mounting a semiconductor die on the package substrate. The semiconductor die is electrically connected to the electrical interconnect layer.

The invention claimed is:

1. A semiconductor package, comprising:
  a package substrate including a dielectric layer over an electrical interconnect layer, wherein the dielectric layer includes a plurality of nonspherical filler particles throughout a resin matrix, wherein a majority of the plurality of nonspherical filler particles has a longest dimension aligned along a vertical direction of the resin matrix; and
  a semiconductor die mounted on the package substrate.

2. The semiconductor package of claim 1, wherein the resin matrix includes an organic resin material, and wherein the plurality of nonspherical filler particles include an inorganic material.

3. The semiconductor package of claim 2, wherein each of the plurality of nonspherical filler particles has a respective aspect ratio greater than 1.

4. The semiconductor package of claim 3, wherein the respective aspect ratios are greater than 1.5.

5. The semiconductor package of claim 3, wherein the plurality of nonspherical filler particles are cylindrical.

6. The semiconductor package of claim 3, wherein the plurality of nonspherical filler particles are ellipsoidal.

7. The semiconductor package of claim 2, wherein the dielectric layer includes a top surface, wherein the plurality of nonspherical filler particles have respective exposed surfaces at the top surface, and wherein the respective exposed surfaces are coplanar with an upper surface of the resin matrix at the top surface.

8. The semiconductor package of claim 7, wherein the respective exposed surfaces have different areal shapes.

9. The semiconductor package of claim 7, wherein each of the plurality of nonspherical filler particles includes a respective longitudinal axis at a respective angle to the respective exposed surface, wherein the respective exposed surface has a respective maximum dimension, and wherein the respective angle relates reciprocally to the respective maximum dimension.

10. The semiconductor package of claim 9, wherein each of the plurality of nonspherical filler particles includes a functionalized outer surface.

11. A semiconductor package assembly, comprising:
a printed circuit board; and
a semiconductor package mounted on the printed circuit board, the semiconductor package including a package substrate including a dielectric layer over an electrical interconnect layer, wherein the dielectric layer includes a plurality of nonspherical filler particles throughout a resin matrix, wherein a majority of the plurality of nonspherical filler particles has a longest dimension aligned along a vertical direction of the resin matrix, and a semiconductor die mounted on the package substrate, wherein the semiconductor die is electrically connected to the electrical interconnect layer.

12. The semiconductor package assembly of claim 11, wherein each of the plurality of nonspherical filler particles has a respective aspect ratio greater than 1.

13. The semiconductor package assembly of claim 12, wherein the respective aspect ratios are greater than 1.5.

14. The semiconductor package assembly of claim 12, wherein the plurality of nonspherical filler particles are one or more of cylindrical or ellipsoidal.

15. The semiconductor package assembly of claim 11, wherein the dielectric layer includes a top surface, wherein the plurality of nonspherical filler particles have respective exposed surfaces at the top surface, and wherein the respective exposed surfaces are coplanar with an upper surface of the resin matrix at the top surface.

* * * * *